United States Patent
Weijers et al.

(10) Patent No.: US 12,550,264 B2
(45) Date of Patent: Feb. 10, 2026

(54) METHOD FOR MAKING A LIGHTING DEVICE

(71) Applicant: SIGNIFY HOLDING B.V., Eindhoven (NL)

(72) Inventors: Aldegonda Lucia Weijers, Eindhoven (NL); Marcel Petrus Lucassen, Landsmeer (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 197 days.

(21) Appl. No.: 18/037,593

(22) PCT Filed: Nov. 29, 2021

(86) PCT No.: PCT/EP2021/083284
§ 371 (c)(1),
(2) Date: May 18, 2023

(87) PCT Pub. No.: WO2022/117479
PCT Pub. Date: Jun. 9, 2022

(65) Prior Publication Data
US 2024/0032199 A1 Jan. 25, 2024

(30) Foreign Application Priority Data

Dec. 1, 2020 (EP) .................................... 20210854

(51) Int. Cl.
*H05K 1/181* (2026.01)
*H05K 1/02* (2006.01)
(Continued)

(52) U.S. Cl.
CPC .......... *H05K 1/181* (2013.01); *H05K 1/0266* (2013.01); *H05K 1/092* (2013.01); *H05K 3/3489* (2013.01); *H05K 2201/10106* (2013.01)

(58) Field of Classification Search
CPC ........................................................ H05K 1/181
(Continued)

(56) References Cited

U.S. PATENT DOCUMENTS 4,963,752 A 10/1990 Landis et al.
10,523,854 B2 * 12/2019 Narayanswamy ..... G03B 19/22
(Continued)

FOREIGN PATENT DOCUMENTS

GB 2211667 * 12/1986
GB 2211667 A 7/1989
(Continued)

*Primary Examiner* — Stanley Tso (57) ABSTRACT

A method (200) for making a lighting device is provided. The lighting device comprises a carrier having a side on which lighting elements are to be mounted in a selected arrangement in relation to each other using the surface-mount equipment. The method comprises marking (201) on the side of the carrier, using a marking substance comprising an ink composition, indications of the positions on the side of the carrier where the lighting elements are to be placed in order for the lighting elements to become mounted on the side of the carrier according to the selected arrangement of the lighting elements in relation to each other, wherein at least one of the surface-mount equipment or the marking substance is arranged such that the marking substance is detectable by the surface-mount equipment. Using the surface-mount equipment and based on the indications marked on the side of the carrier, the lighting elements are placed (204) on the side of the carrier so that the lighting elements become mounted on the side of the carrier in accordance with the selected arrangement of the lighting elements in relation to each other.

11 Claims, 4 Drawing Sheets

(51) Int. Cl.
*H05K 1/09* (2006.01)
*H05K 3/3489* (2026.01)

(58) Field of Classification Search
USPC .......................................................... 174/260
See application file for complete search history.

(56) References Cited

U.S. PATENT DOCUMENTS

| | | | |
|---|---|---|---|
| 2010/0281719 A1* | 11/2010 | Driessen | B42D 15/022 40/124.02 |
| 2011/0020970 A1* | 1/2011 | Caiger | H05K 3/0076 427/259 |
| 2016/0141192 A1 | 5/2016 | Uneyama et al. | |
| 2018/0136255 A1* | 5/2018 | Albert | G01R 31/2806 |

FOREIGN PATENT DOCUMENTS

| | | |
|---|---|---|
| JP | 2006013175 A | 1/2006 |
| WO | 1988001288 A1 | 2/1988 |

* cited by examiner

Fig. 4

METHOD FOR MAKING A LIGHTING DEVICE

CROSS-REFERENCE TO PRIOR APPLICATIONS

This application is the U.S. National Phase application under 35 U.S.C. § 371 of International Application No. PCT/EP2021/083284, filed on Nov. 29, 2021, which claims the benefit of European Patent Application No. 20210854.4, filed on Dec. 1, 2020. These applications are hereby incorporated by reference herein.

TECHNICAL FIELD

The present invention relates to a method for making a lighting device.

BACKGROUND

Lighting devices may comprise a plurality of solid-state lighting elements, such as light-emitting diodes (LEDs), which may be mounted on one or more carriers. The carrier(s) may be referred to as a board, e.g., a printed circuit board (PCB). For example, the carrier may be referred to as a LED board, on which a plurality of LEDs may be mounted. In the manufacturing process of LED boards, surface-mount technology (SMT) may be used for mounting LEDs as well as other electrical components directly onto the surface of a board such as a PCB. As a part of the manufacturing process, black ink is generally applied to the board, such as a PCB, e.g., for indicating to surface-mount equipment such as SMT component placement systems (which may be referred to as pick-and-place machines) where particular LEDs as well as other electrical components should be placed on the board, and/or the proper orientation of the components on the board. When the board is ready for use, e.g., in a lighting device in which the board may be included, the ink is no longer needed, but may still absorb part of the light emitted by the LEDs when the LEDs are switched on. This may reduce the optical efficiency of the lighting device. Such a reduction in optical efficiency may be particularly pronounced in lighting devices which employ light-mixing box optics. Further, in most or even all light engines with (e.g., diffuse) light-exit windows, part of the generated light is reflected towards the board. In particular, lighting devices with relatively small or narrow light-mixing boxes may suffer from this. Many lamps and luminaires employ light-mixing box optics, and light-mixing box optics architectures may become increasingly popular due to the increased use of LEDs of different color.

GB2211667 A1 disclose a method for inspecting printed circuit boards for missing or misplaced components comprises placing visible markings at the component locations so that a properly mounted component completely covers a marking whilst a misplaced or missing component leaves a marking at least partly uncovered. The markings may be made of a fluorescent material which becomes visible under ultra-violet light.

SUMMARY

To avoid a reduction of optical efficiency in lighting devices which employ light-mixing box optics, special reflectors that are designed to cover the regions between LEDs with reflecting material may be used to increase the reflectivity of the mixing box. Such reflectors may increase optical efficiency, but they are often very difficult to make. Further, they are also generally very specific for the particular arrangement of LEDs that is employed in the lighting device. For each new arrangement of LEDs to be employed in the lighting device, a new reflector design may be needed. And sometimes it is prohibitively difficult or even impossible to make such a reflector. For example, if the LEDs are required to be very closely spaced on the board, it might not be possible to design a reflector that covers the regions between the LEDs due to the very close spacing between them.

In view of the above discussion, a concern of the present invention is to provide a method for making a lighting device using surface-mount equipment, which lighting device comprises a carrier on which lighting elements are to be mounted using the surface-mount equipment, which method facilitates or allows for a relatively high optical efficiency in the lighting device.

To address at least one of this concern and other concerns, a method for making a lighting device in accordance with the independent claim is provided. Preferred embodiments are defined by the dependent claims.

According to a first aspect, a method for making a lighting device using surface-mount equipment is provided. The lighting device comprises a carrier having a side on which lighting elements are to be mounted in a selected arrangement in relation to each other using the surface-mount equipment. The lighting elements may be configured to emit light having a wavelength within a selected wavelength range. The method may comprise marking on the side of the carrier, using a marking substance, indications of the positions on the side of the carrier where the lighting elements are to be placed in order for the lighting elements to become mounted on the side of the carrier according to the selected arrangement of the lighting elements in relation to each other. At least one of the surface-mount equipment or the marking substance may be arranged such that the marking substance is detectable by the surface-mount equipment. The method may comprise, using the surface-mount equipment and based on the indications marked on the side of the carrier, placing the lighting elements on the side of the carrier so that the lighting elements become mounted on the side of the carrier in accordance with the selected arrangement of the lighting elements in relation to each other. The marking substance may comprise (or be constituted by) an ink, or ink composition, that does not absorb visible light or at least not light having a wavelength within the selected wavelength range (or does not substantially absorb visible light or at least not light having a wavelength within the selected wavelength range, or only to a relatively small extent). In alternative or in addition, the marking substance may comprise (or be constituted by) an ink, or ink composition, that is modifiable by a reaction, which reaction is caused by at least one of use of the lighting device or the making of the lighting device, such that the ink or ink composition vanishes or becomes reflective for visible light or at least for light having a wavelength within the selected wavelength range (or becomes substantially reflective for visible light or at least for light having a wavelength within the selected wavelength range).

According to a second aspect, a lighting device, which is obtained or obtainable by a method according to the first aspect, is provided.

By marking on the side of the carrier indications of the positions on the side of the carrier where the lighting elements are to be placed in order for the lighting elements to become mounted on the side of the carrier according to the selected arrangement of the lighting elements in relation to each other, it may be facilitated or ensured that the lighting elements once mounted are in the desired to required arrangement on the carrier in relation to each other.

Further, by at least one of the surface-mount equipment or the marking substance being arranged such that the marking substance is detectable by the surface-mount equipment, and by the marking substance comprising or being constituted by an ink composition that does not absorb visible light or at least not light having a wavelength within the selected wavelength range, a reduction of optical efficiency in lighting devices due to the use of the marking substance may be mitigated or even avoided. This is due to that since the ink composition does not absorb visible light—or at least not light having a wavelength within the selected wavelength range—light emitted by the lighting elements during use of the lighting device (when the lighting elements are operated to emit light) may not be absorbed by the ink composition, or may be absorbed to only a very small extent. Further, the thermal performance of the lighting device may thereby be increased.

Further, by at least one of the surface-mount equipment or the marking substance being arranged such that the marking substance is detectable by the surface-mount equipment, and by the marking substance comprising or being constituted by an ink composition that is modifiable by a reaction, which reaction is caused by at least one of use of the lighting device or the making of the lighting device, such that the ink composition vanishes or becomes reflective for visible light—or at least for light having a wavelength within the selected wavelength range (or becomes substantially reflective for visible light or at least for light having a wavelength within the selected wavelength range)—a reduction of optical efficiency in lighting devices due to the use of the marking substance may likewise be mitigated or even avoided. This is due to that light emitted by the lighting elements during use of the lighting device (when the lighting elements are operated to emit light) may not be absorbed by the ink composition, or may be absorbed to only a very small extent, and may instead be reflected by the ink composition having been modified by the reaction. The ink composition may for example be modified by the reaction so as to be evaporated or discolored.

The lighting device may for example employ light-mixing box optics, and may comprise a (possibly diffuse) light-exit window. The lighting device may be comprised in, or be constituted by, a lighting engine or a luminaire, for example.

The lighting device may comprise one or more other components or parts. Such other components or parts may for example comprise a power supply and/or electrical wiring or conductors, a control unit, a housing, and/or fixation arrangements for the different components in the lighting device. The control unit may for example comprise driver circuitry for controlling supply of power to the lighting elements and/or for controlling operation of the lighting elements. The lighting device may comprise other circuitry, e.g., circuitry capable of converting electricity from a power supply to electricity suitable to operate or drive the lighting elements. Such circuitry may be capable of at least converting between Alternating Current and Direct Current and converting voltage into a suitable voltage for operating or driving the lighting elements.

The at least one of the surface-mount equipment or the marking substance being arranged such that the marking substance is detectable by the surface-mount equipment—in accordance with the first aspect—may for example be achieved by the marking substance being reflective in a wavelength range which the surface-mount equipment (e.g., an imaging device thereof) can detect.

The indications of the positions on the side of the carrier where the lighting elements are to be placed in order for the lighting elements to become mounted on the side of the carrier according to the selected arrangement of the lighting elements in relation to each other may encompass, e.g., the desired or required alignment or orientation of the lighting elements with respect to the carrier.

The surface-mount equipment may for example comprise one or more SMT component placement systems, for example one or more SMT component placement systems as known in the art.

The surface-mount equipment may for example comprise an imaging device. The imaging device may for example comprise one or more cameras, such as, for example, one or more charge-coupled device (CCD) image sensors and/or one or more active-pixel sensors (for example one or more CMOS sensors). The imaging device may be configured to capture at least one image, or several images, or a video, of the side of the carrier. The imaging device of the surface-mount equipment may capture at least one image of the side of the carrier. Based on the indications in the captured at least one image, the surface-mount equipment may place the lighting elements on the side of the carrier so that the lighting elements become mounted on the side of the carrier in accordance with the selected arrangement of the lighting elements in relation to each other.

The marking substance may comprise (or be constituted by) an ink composition that is not visible to the naked human eye, but that is visible to surface-mount equipment (e.g., an imaging device thereof) or that can be triggered to become visible to surface-mount equipment (e.g., an imaging device thereof). In the context of the present application, by the ink composition not being visible to the naked human eye, it is meant that the ink composition is not visible, or substantially not visible (e.g., visible to only a very limited degree, or hardly perceivable), to the naked eye of a viewer. In this context, it is assumed that the viewer does not have impaired vision (e.g., not suffering from nearsightedness) and does not have any visual aid, or that the viewer has impaired vision but is provided with a visual aid device for vision correction such as eye glasses, and that the viewer does not use an optical instrument capable of sensing electromagnetic radiation in wavelength range(s) outside the visible light wavelength range).

As described in the foregoing, the marking substance may for example comprise (or be constituted by) an ink composition that does not absorb visible light or at least not light having a wavelength within the selected wavelength range. The imaging device may be sensitive to electromagnetic radiation in at least one wavelength range outside the wavelength range of visible light or at least the selected wavelength range. Thereby, the surface-mount equipment and the marking substance may be arranged such that the marking substance is detectable by the surface-mount equipment. The imaging device may for example be configured to capture the at least one image of the side of the carrier using electromagnetic radiation in the at least one wavelength range outside the wavelength range of visible light or at least the selected wavelength range. The at least one wavelength range outside the wavelength range of visible light or at least the selected wavelength range may for example be comprised in or be constituted by infrared radiation (e.g., at least one of the near infrared range, the mid infrared range and the far infrared range).

In alternative or in addition, the marking substance may comprise (or be constituted by) an ink composition which may comprise or be constituted by a fluorescent ink. The fluorescent ink may be configured to emit electromagnetic radiation in a first wavelength range, responsive to absorption by the fluorescent ink of electromagnetic radiation in a second wavelength range, which may be different from the first wavelength range. The imaging device may be sensitive to electromagnetic radiation in the first wavelength range. The imaging device may be configured to capture the at least one image of the side of the carrier using electromagnetic radiation in the first wavelength range. The capturing by the imaging device of the surface-mount equipment of at least one image of the side of the carrier may comprise emitting electromagnetic radiation in the second wavelength range onto the fluorescent ink. To that end, an electromagnetic radiation source of the surface-mount equipment (e.g., of the imaging device) may be configured to emit electromagnetic radiation in the second wavelength range. Thereby, the surface-mount equipment and the marking substance may be arranged such that the marking substance is detectable by the surface-mount equipment. In alternative or in addition, such an electromagnetic radiation source may be provided separate from the surface-mount equipment. The first wavelength range may for example be comprised in or be constituted by infrared radiation and/or visible light. The second wavelength may for example be comprised in or be constituted by ultraviolet radiation (e.g., at least one of the near ultraviolet range and the extreme ultraviolet range).

The reaction caused by at least one of the use of the lighting device or the making of the lighting device may for example comprises a reaction which may be caused by temperature of the ink composition exceeding a predefined threshold temperature value during the use of the lighting device and/or the making of the lighting device such that the ink composition changes color or evaporates. Thus, the ink composition may be configured such that if temperature thereof exceeds a predefined threshold temperature value, the ink composition evaporates—and thereby vanishes—or changes color, so as to become reflective for visible light or at least for light having a wavelength within the selected wavelength range. The ink composition may for example comprise a thermochromic ink, such as for example, a thermochromic ink manufactured by OliKrom (www.olikrom.com). Examples of irreversible thermochromic ink compositions are disclosed in US 2013/0172182 A1.

The ink composition may for example exceed the predefined threshold temperature value as a result of (i.e. during) the process of making of the lighting device. For example, the ink composition may exceed the predefined threshold temperature value during a reflow process for fixating the lighting elements following the placement of the lighting elements on the side of the carrier. Thus, the lighting elements which have been mounted on the side of the carrier may for example be fixated by means of heating the carrier to a selected temperature by means of a heating device of the surface-mount equipment. In alternative or in addition such a heating device may be provided separate from the surface-mount equipment. The predefined threshold temperature value may be less than the selected temperature. Thus, the ink composition may be configured such that its predefined threshold temperature triggering the above-mentioned modification of the ink composition is below a typical temperature of the ink composition/carrier reached as part of a process for fixating the lighting elements on the carrier. Thereby, the ink composition may change color or evaporate during the fixating of the lighting elements which have been mounted on the side of the carrier by means of the heating of the carrier to the selected temperature. As indicated in the foregoing, the fixating of the lighting elements which have been mounted on the side of the carrier, by means of heating the carrier to a selected temperature by means of a heating device, may for example comprises a reflow process. The heating device may for example be comprised in reflow equipment. A reflow process is made at relatively high temperatures, for example about 250° C. Accordingly, the selected temperature to which the carrier is heated by means of a heating device may be about 250° C., which may be higher than the predefined threshold temperature triggering the above-mentioned modification of the ink composition.

In alternative or in addition, the ink composition may for example exceed the predefined threshold temperature value as a result of (e.g., during) the use of the lighting device. The lighting elements may for example be arranged such that they during the use of the lighting device (e.g., when the lighting elements are operated to emit light), when mounted on the side of the carrier in accordance with the selected arrangement of the lighting elements in relation to each other, give off an amount of heat that is at least partly transferred to the carrier such as to increase the temperature of the ink composition above the predefined threshold temperature value. Thus, the ink composition may be configured such that its predefined threshold temperature triggering the above-mentioned modification of the ink composition is below a typical temperature of the ink composition/carrier reached when the lighting elements are used—e.g., operated to be switched on and emitting light. Thus, the heat given off the lighting elements during use of the lighting device (e.g., the first use of the lighting device) may be sufficient to increase the temperature of the ink composition such that the above-mentioned modification of the ink composition is triggered.

There may be another or other triggers than temperature of the ink composition that triggers the above-mentioned modification of the ink composition. For example, the reaction caused by at least one of the use of the lighting device or the making of the lighting device may comprise a reaction caused by the ink composition receiving an electromagnetic radiation flux exceeding a predefined threshold electromagnetic radiation flux during the use of the lighting device and/or the making of the lighting device such that the ink composition changes color or evaporates. The ink composition may for example comprise a photochromic ink, such as for example, a photochromic ink manufactured by OliKrom (www.olikrom.com). The lighting elements may for example be arranged such that they during the use of the lighting device (e.g., when the lighting elements are operated to emit light), when mounted on the side of the carrier in accordance with the selected arrangement of the lighting elements in relation to each other, collectively emit an electromagnetic radiation flux received by the ink composition that exceeds the predefined threshold electromagnetic radiation flux. Thus, the light emitted by the lighting elements during use of the lighting device (e.g., the first use of the lighting device) may be sufficient to trigger the above-mentioned modification of the ink composition.

In alternative or in addition, the reaction caused by at least one of the use of the lighting device or the making of the lighting device may comprises a reaction caused by exposing the ink composition to electromagnetic radiation, whereby the ink composition can be removed from the carrier. The electromagnetic radiation which the ink composition may be exposed to may for example comprise or be constituted by optical radiation, or laser radiation. The electromagnetic radiation may be provided by a source different from the lighting elements. The side of the carrier may be exposed to electromagnetic radiation, whereby the ink composition becomes exposed to the electromagnetic radiation. In that way, the ink composition may be removed from the carrier following the placing of the lighting elements on the side of the carrier so that the lighting elements become mounted on the side of the carrier in accordance with the selected arrangement of the lighting elements in relation to each other.

In alternative or in addition, the reaction caused by at least one of the use of the lighting device or the making of the lighting device may comprise a reaction caused by washing the ink composition with a liquid including at least one chemical composition that is capable of dissolving the ink composition, whereby the ink composition can be removed from the carrier. The side of the carrier may be washed with the liquid, whereby the ink composition becomes washed with the liquid. In that way, the ink composition may be removed from the carrier following the placing of the lighting elements on the side of the carrier so that the lighting elements become mounted on the side of the carrier in accordance with the selected arrangement of the lighting elements in relation to each other.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the invention will be described below with reference to the accompanying drawings.

Each of FIGS. 2 to 4 is a schematic flowchart of a method according to an embodiment of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art. In the drawings, identical reference numerals denote the same or similar components having a same or similar function, unless specifically stated otherwise.

Figure 1:
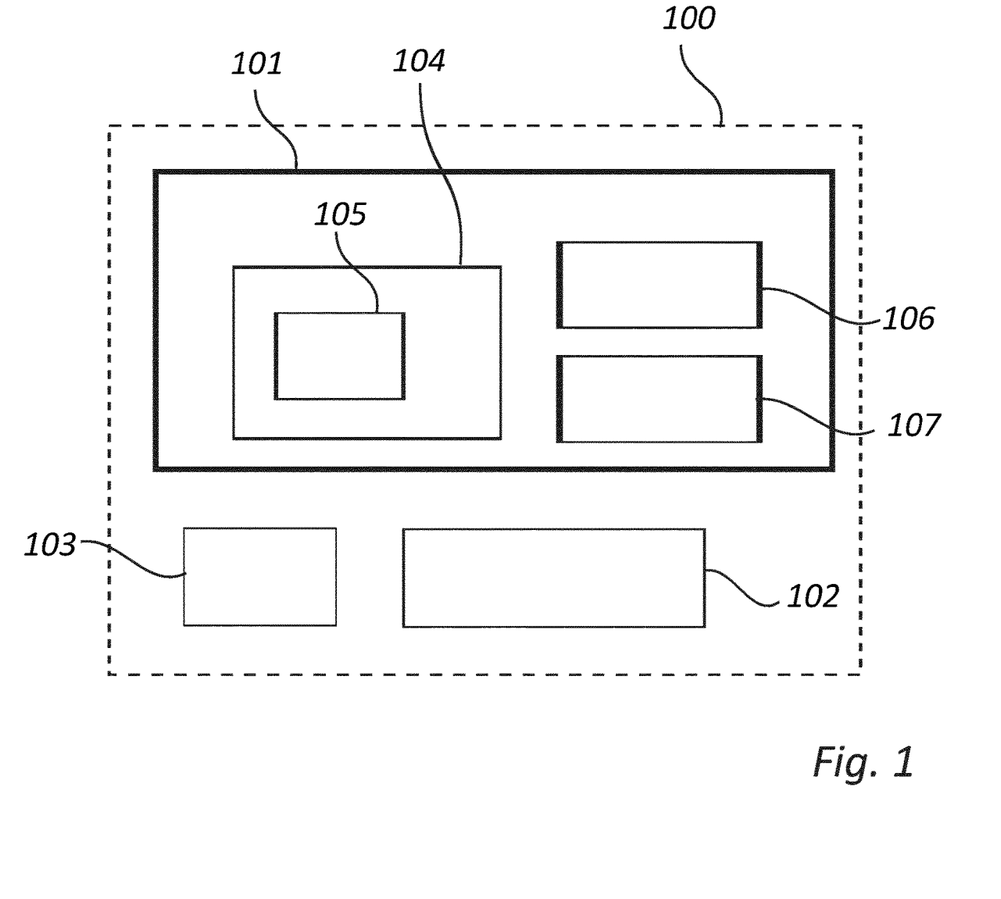
FIG. 1 is a schematic block diagram of a system for implementing an embodiment of the present invention.

FIG. 1 is a schematic block diagram of a system 100 for implementing an embodiment of the present invention. The system 100 is for making a lighting device using surface-mount equipment, which lighting device comprises a carrier having a side on which lighting elements are to be mounted in a selected arrangement in relation to each other using the surface-mount equipment. The system 100 includes surface-mount equipment 101, a carrier 102 and lighting elements 103, which are to be mounted on a side of the carrier 102 in a selected arrangement in relation to each other using the surface-mount equipment 101. The carrier 102, which may be referred to as a board, may for example include one or more printed circuit boards (PCBs). For example, the carrier may be referred to as a light-emitting diode (LED) board, on which a plurality of LEDs are to be mounted. Accordingly, the lighting elements 103 may for example comprise LEDs, but are not limited thereto, and may for example comprise another or other types of solid-state lighting elements. Each or any of the lighting elements 103 may for example comprise inorganic LED(s) and/or organic LED(s) (OLEDs). Each or any of the lighting elements 103 may for example comprise polymer/polymeric LEDs, violet LEDs, blue LEDs, optically pumped phosphor coated LEDs, optically pumped nano-crystal LEDs. As used herein, the term "LED" can encompass a bare LED die arranged in a housing, which may be referred to as a LED package. The surface-mount equipment 101 may include an imaging device 104, which may comprise one or more cameras, and which may include an electromagnetic radiation source 105. The surface-mount equipment 101 may include a heating device 106, which for example may be comprised in reflow equipment. For mounting the lighting elements 103 on the side of the carrier 102, the surface-mount equipment 101 may comprise a surface mount technology (SMT) component placement system 107, which may be referred to as a pick-and-place machine. The components of the system 100 will be described further in the following with reference to the flowcharts in FIGS. 2, 3 and 4.

Figure 2:
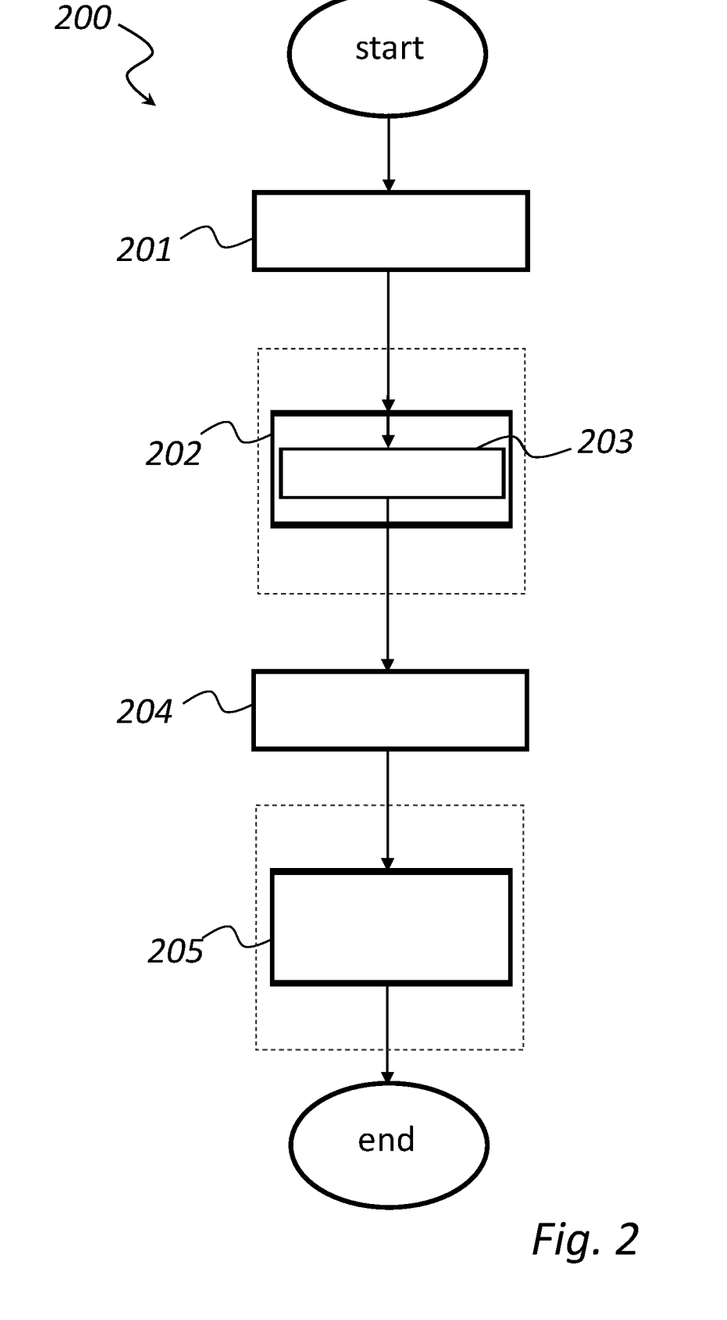

FIG. 2 is a schematic flowchart of a method 200 according to an embodiment of the present invention. With reference to FIG. 2 and also with reference to FIG. 1, the method 200 is for making a lighting device using surface-mount equipment 101, the lighting device comprising a carrier 102 having a side on which lighting elements 103 are to be mounted in a selected arrangement in relation to each other using the surface-mount equipment 101. The lighting elements 103 are configured to emit light having a wavelength within a selected wavelength range.

The method 200 comprises, at 201, marking on the side of the carrier 102, using a marking substance, indications of the positions on the side of the carrier 102 where the lighting elements 103 are to be placed in order for the lighting elements 103 to become mounted on the side of the carrier 102 according to the selected arrangement of the lighting elements 103 in relation to each other.

In addition, the marking substance may be used to mark the positions on the side of the carrier 102 where any electrical components other than the lighting elements 103 are to be placed. The markings may include outlines of boxes (inside of which the lighting elements 103 and possibly any other electrical components should be placed) and possibly the ID numbers/names of the lighting elements 103 and possibly any other electrical components.

At least one of the surface-mount equipment 101 or the marking substance is arranged such that the marking substance is detectable by the surface-mount equipment 101.

The marking substance comprises at least one of: (1) an ink or ink composition that does not absorb visible light or at least not light having a wavelength within the selected wavelength range, or (2) an ink or ink composition that is modifiable by a reaction, which reaction is caused by at least one of use of the lighting device or the making of the lighting device, such that ink or ink composition vanishes or becomes reflective for visible light or at least for light having a wavelength within the selected wavelength range.

The method 200 comprises, at 204, using the surface-mount equipment 101 and based on the indications marked on the side of the carrier 102, placing the lighting elements 103 on the side of the carrier 102 so that the lighting elements 103 become mounted on the side of the carrier in accordance with the selected arrangement of the lighting elements 103 in relation to each other.

The method 200 may then end.

After the placing of the lighting elements 103 and possibly any electrical components other than the lighting elements 103 on the side of the carrier 102, markings of the positions on the side of the carrier 102 where the lighting elements 103 and possibly any electrical components other than the lighting elements 103 are to be placed have little value, although sometimes such markings are used for inspection of whether all components are placed in their respective boxes. Thus, the markings may be removed after the placing of the lighting elements 103 and possibly any electrical components other than the lighting elements 103 on the side of the carrier 102, or after any inspection such as mentioned in the foregoing, for example by the ink composition vanishing as described herein.

Possibly, there may be an optional step 205 before the method 200 ends.

Also, between the steps 201 and 204, the method 200 may comprise an optional step 202 and possibly also an optional step 203. It is to be understood that step 201 may be immediately followed by step 204, with the steps 202 and 203 being omitted. The steps in FIG. 2 within the dashed boxes are hence optional, and may be omitted.

The optional steps 202, 203 and 205 will be described in the following.

The surface-mount equipment 101 may comprise an imaging device 104 which may be configured to capture at least one image of the side of the carrier 201. The method 200 may comprise, at 202, the imaging device 104 of the surface-mount equipment 101 capturing at least one image of the side of the carrier 102.

The step 204 may be based on the indications in the captured at least one image. Thus, based on the indications in the captured at least one image, the surface-mount equipment 101 may place the lighting elements 103 on the side of the carrier 102 so that the lighting elements 103 become mounted on the side of the carrier in accordance with the selected arrangement of the lighting elements 103 in relation to each other.

The marking substance may comprise an ink composition comprising or being constituted by a fluorescent ink. The fluorescent ink may be configured to emit electromagnetic radiation in a first wavelength range responsive to absorption by the fluorescent ink of electromagnetic radiation in a second wavelength range, which may be different from the first wavelength range. The imaging device 104 may be sensitive to electromagnetic radiation in the first wavelength range. The imaging device 104 may be configured to capture the at least one image of the side of the carrier 102 using electromagnetic radiation in the first wavelength range.

The capturing by the imaging device 104 of the surface-mount equipment 101 of at least one image of the side of the carrier 102, at 202, may comprise, at 203, an electromagnetic radiation source 105 of the surface-mount equipment 101, which electromagnetic radiation source 105 may be configured to emit electromagnetic radiation in the second wavelength range, emitting electromagnetic radiation in the second wavelength range onto the fluorescent ink. By emitting electromagnetic radiation in the second wavelength range onto the fluorescent ink and by absorption of the electromagnetic radiation in the second wavelength by the fluorescent ink, the fluorescent ink may emit electromagnetic radiation in the first wavelength range. The first wavelength range may for example be comprised in or be constituted by infrared radiation and/or visible light. The second wavelength may for example be comprised in or be constituted by ultraviolet radiation (e.g., at least one of the near ultraviolet range and the extreme ultraviolet range).

The optional step 205 may be carried out in lieu of the optional steps 202 and possibly 203. However, it is to be understood that all of the optional steps 202, 203 and 205 could be carried out.

The reaction caused by at least one of the use of the lighting device or the making of the lighting device may comprises a reaction caused by temperature of the ink composition exceeding a predefined threshold temperature value during the use of the lighting device and/or the making of the lighting device such that the ink composition changes color or evaporates. At 205, the lighting elements 103 which have been mounted on the side of the carrier 102 may be fixated (i.e. their positions may be fixated) by means of heating the carrier 102 to a selected temperature by means of a heating device 106 of the surface-mount equipment 101. The predefined threshold temperature value may be less than the selected temperature such that the ink composition changes color or evaporate during the fixating of the lighting elements 103 which have been mounted on the side of the carrier 102 by means of the heating of the carrier 102 to the selected temperature. The fixating of the lighting elements 103 which have been mounted on the side of the carrier 102 at 205 by means of heating the carrier 102 to a selected temperature by means of the heating device 106 may for example comprise a reflow process.

Figure 3:
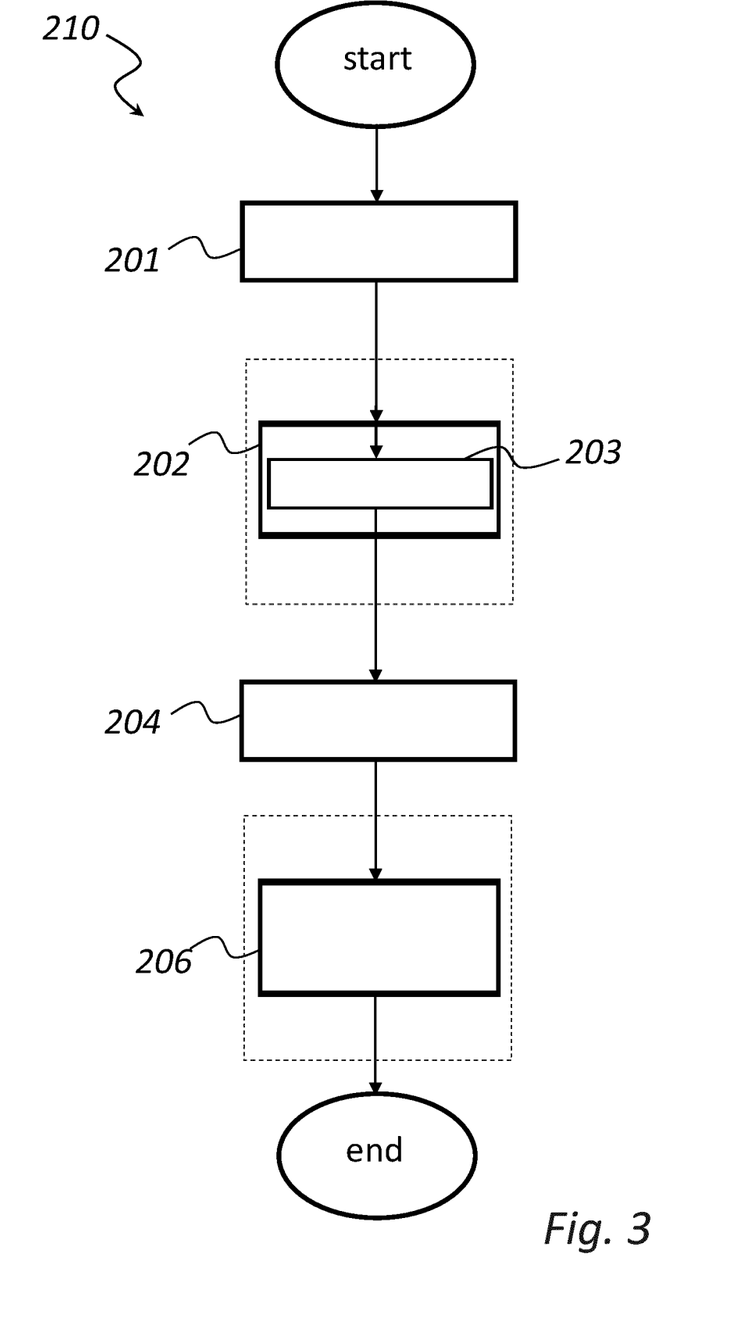

FIG. 3 is a schematic flowchart of a method 210 according to an embodiment of the present invention. The method 210 illustrated in FIG. 3 is similar to the method 200 illustrated in FIG. 2, and the same reference numerals in FIGS. 2 and 3 denote the same or similar steps. The method 210 illustrated in FIG. 3 differs from the method 200 illustrated in FIG. 2 in that it comprises a step 206 in lieu of the step 205 in the method 200 illustrated in FIG. 2. The steps in FIG. 3 within the dashed boxes are optional, and may be omitted. The reaction caused by at least one of the use of the lighting device or the making of the lighting device may comprise a reaction caused by exposing the ink composition to electromagnetic radiation (e.g., optical radiation, or laser radiation), whereby the ink composition can be removed (or substantially removed) from the carrier 102. At 206, the side of the carrier 102 is exposed to electromagnetic radiation, whereby the ink composition is exposed to the electromagnetic radiation. The electromagnetic radiation may be provided by a source different from the lighting elements. For example, step 206 may utilize an optical radiation source, or a laser.

Figure 4:
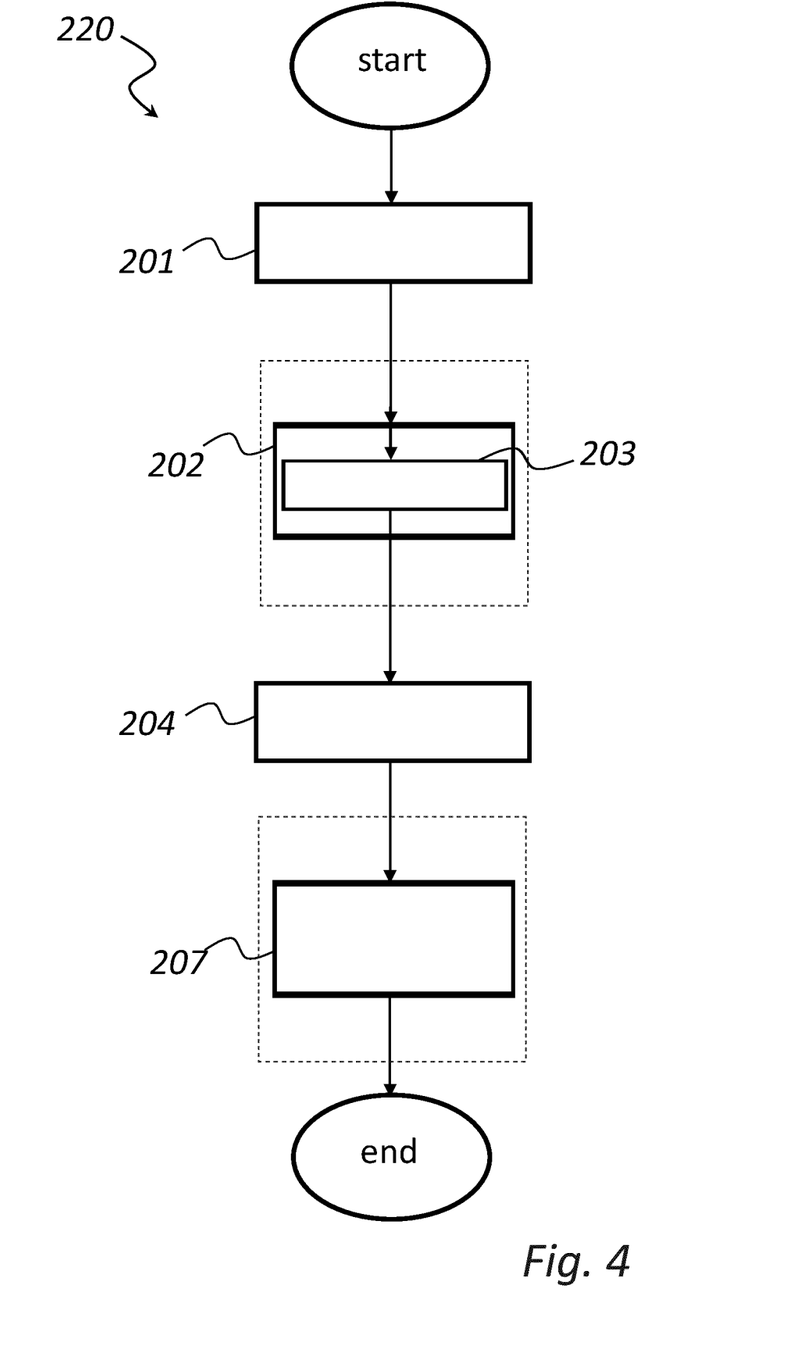

FIG. 4 is a schematic flowchart of a method 220 according to an embodiment of the present invention. The method 220 illustrated in FIG. 4 is similar to the methods 200 and 210 illustrated in FIGS. 2 and 3, respectively, and the same reference numerals in FIG. 4 and in FIGS. 2 and 3 denote the same or similar steps. The method 220 illustrated in FIG. 4 differs from the methods 200 and 210 illustrated in FIGS. 2 and 3, respectively, in that it comprises a step 207 in lieu of the step 205 in the method 200 illustrated in FIG. 2 and in lieu of the step 206 in the method 210 illustrated in FIG. 3. The steps in FIG. 4 within the dashed boxes are optional, and may be omitted. The reaction caused by at least one of the use of the lighting device or the making of the lighting device may comprise a reaction caused by washing the ink composition with a liquid including at least one chemical composition that is capable of dissolving the ink composition, whereby the ink composition can be removed (or substantially removed) from the carrier 102. At 207, the side of the carrier 102 is washed with the liquid, whereby the ink composition is washed with the liquid.

In conclusion, a method for making a lighting device is provided. The lighting device comprises a carrier having a side on which lighting elements are to be mounted in a selected arrangement in relation to each other using the surface-mount equipment. The method comprises marking on the side of the carrier, using a marking substance comprising an ink composition, indications of the positions on the side of the carrier where the lighting elements are to be placed in order for the lighting elements to become mounted on the side of the carrier according to the selected arrangement of the lighting elements in relation to each other, wherein at least one of the surface-mount equipment or the marking substance is arranged such that the marking substance is detectable by the surface-mount equipment. Using the surface-mount equipment and based on the indications marked on the side of the carrier, the lighting elements are placed on the side of the carrier so that the lighting elements become mounted on the side of the carrier in accordance with the selected arrangement of the lighting elements in relation to each other.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for making a lighting device using surface-mount equipment, the lighting device comprising a carrier having a side on which lighting elements are to be mounted in a selected arrangement in relation to each other using the surface-mount equipment, the lighting elements being configured to emit light having a wavelength within a selected wavelength range, the method comprising:
marking on the side of the carrier, using a marking substance, indications of the positions on the side of the carrier where the lighting elements are to be placed in order for the lighting elements to become mounted on the side of the carrier according to the selected arrangement of the lighting elements in relation to each other, wherein at least one of the surface-mount equipment or the marking substance is arranged such that the marking substance is detectable by the surface-mount equipment; and
using the surface-mount equipment and based on the indications marked on the side of the carrier, placing the lighting elements on the side of the carrier so that the lighting elements become mounted on the side of the carrier in accordance with the selected arrangement of the lighting elements in relation to each other;
wherein the marking substance comprises an ink composition that is modifiable by a reaction, which reaction is caused by at least one of use of the lighting device or the making of the lighting device, such that ink composition vanishes or becomes reflective for visible light or at least for light having a wavelength within the selected wavelength range;
wherein the reaction caused by at least one of the use of the lighting device or the making of the lighting device comprises a reaction caused by temperature of the ink composition exceeding a predefined threshold temperature value during the use of the lighting device and/or the making of the lighting device such that the ink composition changes color or evaporates.

2. A method according to claim 1, wherein the surface-mount equipment comprises an imaging device configured to capture at least one image of the side of the carrier, and wherein the method comprises:
the imaging device of the surface-mount equipment capturing at least one image of the side of the carrier; and
based on the indications in the captured at least one image, the surface-mount equipment placing the lighting elements on the side of the carrier so that the lighting elements become mounted on the side of the carrier in accordance with the selected arrangement of the lighting elements in relation to each other.

3. A method according to claim 2, wherein the marking substance comprises an ink composition that does not absorb visible light or at least not light having a wavelength within the selected wavelength range, and wherein the imaging device is sensitive to electromagnetic radiation in at least one wavelength range outside the wavelength range of visible light or at least the selected wavelength range, and the imaging device is configured to capture the at least one image of the side of the carrier using electromagnetic radiation in the at least one wavelength range outside the wavelength range of visible light or at least the selected wavelength range.

4. A method according to claim 2, wherein the marking substance comprises an ink composition comprising or being constituted by a fluorescent ink, wherein the fluorescent ink is configured to emit electromagnetic radiation in a first wavelength range responsive to absorption by the fluorescent ink of electromagnetic radiation in a second wavelength range, different from the first wavelength range, wherein the imaging device is sensitive to electromagnetic radiation in the first wavelength range, and the imaging device is configured to capture the at least one image of the side of the carrier using electromagnetic radiation in the first wavelength range;
wherein the capturing by the imaging device of the surface-mount equipment of at least one image of the side of the carrier comprises:
an electromagnetic radiation source of the surface-mount equipment, configured to emit electromagnetic radiation in the second wavelength range, emitting electromagnetic radiation in the second wavelength range onto the fluorescent ink.

5. A method according to claim 1, further comprising:
fixating the lighting elements which have been mounted on the side of the carrier by means of heating the carrier to a selected temperature by means of a heating device of the surface-mount equipment;

wherein the predefined threshold temperature value is less than the selected temperature such that the ink composition changes color or evaporate during the fixating of the lighting elements which have been mounted on the side of the carrier by means of the heating of the carrier to the selected temperature.

6. A method according to claim 5, wherein the fixating of the lighting elements which have been mounted on the side of the carrier by means of heating the carrier to a selected temperature by means of a heating device comprises a reflow process.

7. A method according to claim 1, wherein the lighting elements are arranged such that they during the use of the lighting device, when mounted on the side of the carrier in accordance with the selected arrangement of the lighting elements in relation to each other, give off an amount of heat that is at least partly transferred to the carrier such as to increase the temperature of the ink composition above the predefined threshold temperature value.

8. A method according to claim 1, wherein the reaction caused by at least one of the use of the lighting device or the making of the lighting device comprises a reaction caused by exposing the ink composition to electromagnetic radiation, whereby the ink composition can be removed from the carrier, wherein the method further comprises:
exposing the side of the carrier to electromagnetic radiation, whereby the ink composition is exposed to the electromagnetic radiation.

9. A method for making a lighting device using surface-mount equipment, the lighting device comprising a carrier having a side on which lighting elements are to be mounted in a selected arrangement in relation to each other using the surface-mount equipment, the lighting elements being configured to emit light having a wavelength within a selected wavelength range, the method comprising:
marking on the side of the carrier, using a marking substance, indications of the positions on the side of the carrier where the lighting elements are to be placed in order for the lighting elements to become mounted on the side of the carrier according to the selected arrangement of the lighting elements in relation to each other, wherein at least one of the surface-mount equipment or the marking substance is arranged such that the marking substance is detectable by the surface-mount equipment; and
using the surface-mount equipment and based on the indications marked on the side of the carrier, placing the lighting elements on the side of the carrier so that the lighting elements become mounted on the side of the carrier in accordance with the selected arrangement of the lighting elements in relation to each other;
wherein the marking substance comprises an ink composition that is modifiable by a reaction, which reaction is caused by at least one of use of the lighting device or the making of the lighting device, such that ink composition vanishes or becomes reflective for visible light or at least for light having a wavelength within the selected wavelength range;
wherein the reaction caused by at least one of the use of the lighting device or the making of the lighting device comprises a reaction caused by the ink composition receiving an electromagnetic radiation flux exceeding a predefined threshold electromagnetic radiation flux during the use of the lighting device and/or the making of the lighting device such that the ink composition changes color or evaporates.

10. A method according to claim 9, wherein the lighting elements are arranged such that they during the use of the lighting device, when mounted on the side of the carrier in accordance with the selected arrangement of the lighting elements in relation to each other, collectively emit an electromagnetic radiation flux received by the ink composition that exceeds the predefined threshold electromagnetic radiation flux.

11. A method for making a lighting device using surface-mount equipment, the lighting device comprising a carrier having a side on which lighting elements are to be mounted in a selected arrangement in relation to each other using the surface-mount equipment, the lighting elements being configured to emit light having a wavelength within a selected wavelength range, the method comprising:
marking on the side of the carrier, using a marking substance, indications of the positions on the side of the carrier where the lighting elements are to be placed in order for the lighting elements to become mounted on the side of the carrier according to the selected arrangement of the lighting elements in relation to each other, wherein at least one of the surface-mount equipment or the marking substance is arranged such that the marking substance is detectable by the surface-mount equipment; and
using the surface-mount equipment and based on the indications marked on the side of the carrier, placing the lighting elements on the side of the carrier so that the lighting elements become mounted on the side of the carrier in accordance with the selected arrangement of the lighting elements in relation to each other;
wherein the marking substance comprises an ink composition that is modifiable by a reaction, which reaction is caused by at least one of use of the lighting device or the making of the lighting device, such that ink composition vanishes or becomes reflective for visible light or at least for light having a wavelength within the selected wavelength range;
wherein the reaction caused by at least one of the use of the lighting device or the making of the lighting device comprises a reaction caused by washing the ink composition with a liquid including at least one chemical composition that is capable of dissolving the ink composition, whereby the ink composition can be removed from the carrier, wherein the method further comprises:
washing the side of the carrier with the liquid, whereby the ink composition is washed with the liquid.

\* \* \* \* \*